(12) United States Patent
Ferrara, Jr. et al.

(10) Patent No.: US 9,403,358 B1
(45) Date of Patent: Aug. 2, 2016

(54) SYSTEM AND METHOD FOR FORMING HYDROPHOBIC STRUCTURES IN A HYDROPHILIC PRINT MEDIUM

(71) Applicant: Xerox Corporation, Norwalk, CT (US)

(72) Inventors: Joseph M. Ferrara, Jr., Webster, NY (US); Jing Zhou, Pittsford, NY (US); Wayne A. Buchar, Bloomfield, NY (US); Nancy Y. Jia, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 14/689,723

(22) Filed: Apr. 17, 2015

(51) Int. Cl.
*B41J 2/01* (2006.01)
*B41J 11/00* (2006.01)
*B41J 3/60* (2006.01)
*B41M 7/00* (2006.01)
*B41M 5/00* (2006.01)
*B41M 3/00* (2006.01)
*H05K 3/12* (2006.01)

(52) U.S. Cl.
CPC *B41J 2/01* (2013.01); *B41J 11/002* (2013.01); *B41J 3/60* (2013.01); *B41M 3/00* (2013.01); *B41M 5/0011* (2013.01); *B41M 7/00* (2013.01); *H05K 3/12* (2013.01)

(58) Field of Classification Search
None
See application file for complete search history.

(56) References Cited

U.S. PATENT DOCUMENTS

| 6,723,500 | B2 | 4/2004 | Yu |
| 8,491,083 | B2 * | 7/2013 | Boday ................ B29C 67/0059 347/20 |
| 2004/0179053 | A1 | 9/2004 | Itoh |
| 2007/0059718 | A1 | 3/2007 | Toner et al. |
| 2011/0123398 | A1 | 5/2011 | Carrilho et al. |
| 2012/0198684 | A1 | 8/2012 | Carrilho et al. |
| 2013/0034869 | A1 | 2/2013 | Whitesides et al. |
| 2014/0134074 | A1 | 5/2014 | Ovaska et al. |

OTHER PUBLICATIONS

Allen Wyatt; Printing a Document's Mirror Image; Allen Wyatt's Wordtips menu interface; Nov. 5, 2014; 3 Pages; http://word.tips.net/T001475_Printing_a_Documents_Mirror_Image.html.

* cited by examiner

*Primary Examiner* — Lisa M Solomon
(74) *Attorney, Agent, or Firm* — Maginot Moore & Beck LLP

(57) ABSTRACT

A method of forming hydrophobic structures in a hydrophilic print medium includes operating a plurality of inkjets to form an arrangement of hydrophobic material on first side of a print medium that moves in a process direction at a predetermined velocity. The method further includes moving the print medium through a convection heater at the predetermined velocity to enable the hydrophobic material to penetrate the print medium to form hydrophobic structures within the print medium.

10 Claims, 7 Drawing Sheets

SYSTEM AND METHOD FOR FORMING HYDROPHOBIC STRUCTURES IN A HYDROPHILIC PRINT MEDIUM

TECHNICAL FIELD

This disclosure relates generally to systems and methods for controlling the deposition of a hydrophobic material in a porous substrate and, more particularly, to systems and methods for forming hydrophobic structures in a hydrophilic print medium in an inkjet printing system.

BACKGROUND

Paper-based chemical assay devices include a paper substrate, wax that forms fluid channels and other fluid structures in the paper, and one or more reagents. Common examples of paper-based chemical assay devices include biomedical testing devices that are made of paper and perform biochemical assays and diagnostics in test fluids such as blood, urine and saliva. The devices are small, lightweight and low cost and have potential applications as diagnostic devices in healthcare, military and homeland security to mention a few. The current state of the art paper diagnostic device is limited on fluidic feature resolution and manufacturing compatibility due to uncontrolled reflow of the wax channel after the wax is printed on the paper.

FIG. 7A and FIG. 7B depict the prior art processes for melting wax that is formed on a paper substrate in a reflow oven. The melting process is required for the wax to penetrate into the paper instead of remaining in a layer on the surface of the paper. In FIG. 7A, a reflow oven heats a paper substrate with solidified wax to a temperature of approximately 150° C. The entire paper and the wax are heated to the same temperature in an isotropic manner. As depicted in FIG. 7B, the wax melts and spreads both into the porous paper and across the surface of the paper in a roughly uniform manner. The prior art reflow ovens can be used for low-volume production of biomedical devices. The wax melts and penetrates into the paper over the course of one or more minutes while the reflow oven holds the paper.

Prior art reflow ovens such as the oven of FIG. 7A are not suitable for use in large-scale production of biomedical devices and other devices that include structures that are formed within paper substrates. For example, in one embodiment a cut-sheet inkjet printer forms printed pattern of wax or another suitable hydrophobic material on a single sheet of paper, and the reflow oven in FIG. 7A heats the sheet of paper for two minutes to enable the wax to penetrate the paper. However, mass-production of a large number of the biomedical devices in an efficient manner requires the use of large scale inkjet printing systems that form printed patterns on large rolls of paper or other suitable substrates. The prior art reflow ovens are impractical for mass production of the biomedical devices with large scale printing systems. Consequently, improved methods and systems for the production of biomedical devices that do not require the prior art reflow ovens would be beneficial.

SUMMARY

In one embodiment, a method of forming hydrophobic structures in a hydrophilic print medium has been developed. The method includes moving with a media transport a print medium formed from a hydrophilic material in a process direction through a first print zone and a convection heater at a predetermined velocity, operating with a controller a first plurality of inkjets in the first print zone to form a first predetermined arrangement of a hydrophobic material on a region of a first side of the print medium as the print medium moves through the first print zone, and operating the convection heater to enable the first predetermined arrangement of the hydrophobic material to penetrate the hydrophilic substrate to form at least one hydrophobic structure within the region of the print medium as the region of the print medium moves through the convection heater.

In another embodiment, an inkjet printer that is configured to form hydrophobic structures in a hydrophilic print medium has been developed. The printer includes a first print zone including a first plurality of inkjets configured to eject drops of a hydrophobic material onto a first side of a print medium formed from a hydrophilic material, a convection heater, a media transport configured to move the print medium in a process direction through the first print zone and the convection heater, and a controller operatively connected to the first plurality of inkjets in the first print zone, the convection heater, and the media transport. The controller is configured to operate the media transport to move the print medium in the process direction at a predetermined velocity, operate the first plurality of inkjets in the first print zone to form a first predetermined arrangement of a hydrophobic material on a region of a first side of the print medium as the print medium moves through the first print zone, and operate the convection heater to enable the first predetermined arrangement of the hydrophobic material to penetrate the hydrophilic substrate to form at least one hydrophobic structure within the region of the print medium as the region of the print medium moves through the convection heater.

BRIEF DESCRIPTION OF THE DRAWINGS

The foregoing aspects and other features of an apparatus that forms hydrophobic structures in a hydrophilic substrate are explained in the following description, taken in connection with the accompanying drawings.

DETAILED DESCRIPTION

Figure 1A:
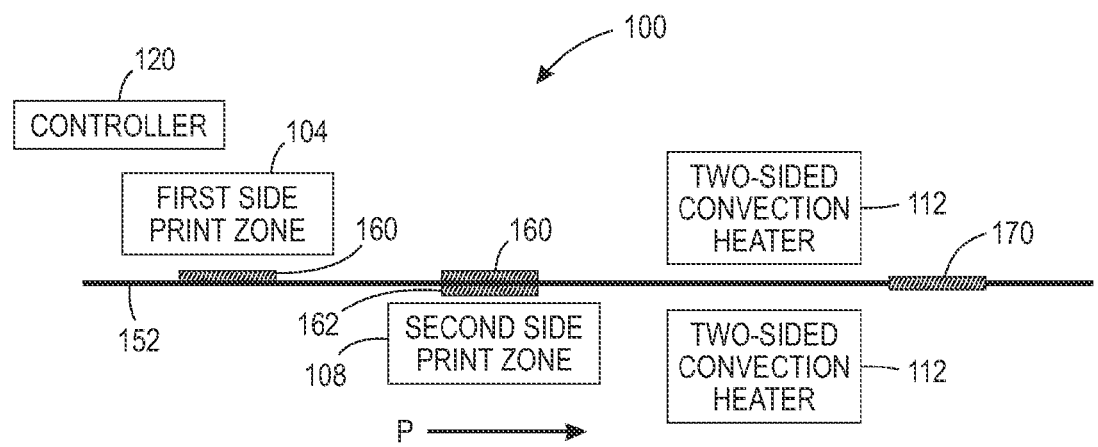
FIG. 1A is a schematic diagram of an inkjet printing system that forms hydrophobic structures in a hydrophilic print medium.

For a general understanding of the environment for the system and method disclosed herein as well as the details for the system and method, reference is made to the drawings. In the drawings, like reference numerals have been used throughout to designate like elements. As used herein, the word "printer" encompasses any apparatus that produces images with resins or colorants on media, such as digital copiers, bookmaking machines, facsimile machines, multi-function machines, or the like. In the description below, a printer is further configured to deposit a melted wax, phase-change ink, or other hydrophobic material onto a porous substrate, such as paper. While the printers described below are inkjet printers and the hydrophobic phase change material can be a phase-change ink in some embodiments, in some configurations the hydrophobic material is an optically transparent wax or other material that does not have a particular color. The visual representations of the hydrophobic material that are presented below are for illustrative purposes only, and different embodiments described below use hydrophobic materials with no coloration or with any coloration that is suitable for use with a chemical assay device.

The printer is optionally configured to apply a temperature gradient and pressure to the substrate that spreads the hydrophobic material and enables the hydrophobic material to penetrate into the porous substrate to form hydrophobic structures including channels and barriers that control the capillary flow of liquids, including water, through the substrate.

As used herein, the terms "hydrophilic material" and "hydrophilic substrate" refer to materials that absorb water and enable diffusion of the water through the material via capillary action. One common example of a hydrophilic substrate is paper, such as cellulose filter paper, chromatography paper, or any other suitable type of paper. The hydrophilic substrates are formed from porous materials that enable water and other biological fluids that include water, such as blood, urine, saliva, and other biological fluids, to diffuse into the substrate. As described below, a hydrophobic material is embedded in the hydrophilic substrate to form fluid channel barriers and other hydrophobic structures that control the diffusion of the fluid through the hydrophilic substrate.

As used herein, the term "hydrophobic material" refers to any material that resists adhesion to water and is substantially impermeable to a flow of water through capillary motion. When embedded in a porous substrate, such as paper, the hydrophobic material acts as a barrier to prevent the diffusion of water through portions of the substrate that include the hydrophobic material. The hydrophobic material also acts as a barrier to many fluids that include water, such as blood, urine, saliva, and other biological fluids. As described below, the hydrophobic material is embedded in a porous substrate to form hydrophobic structures including channel walls and other structures that control the capillary diffusion of the liquid through the substrate. In one embodiment, the substrate also includes biochemical reagents that are used to test various properties of a fluid sample. The hydrophobic material forms channels to direct the fluid to different locations in the substrate that have deposits of the chemical reagents. The hydrophobic material is also substantially chemically inert with respect to the fluids in the channel to reduce or eliminate chemical reactions between the hydrophobic material and the fluids. A single sample of the fluid diffuses through the channels in the substrate to react with different reagents in different locations of the substrate to provide a simple and low-cost device for performing multiple biochemical tests on a single fluid sample.

As used herein, the term "phase-change material" refers to a hydrophobic material with a solid phase at room temperature and standard atmospheric pressure (e.g. 20° C. and one atmosphere of pressure) and a liquid phase at an elevated temperature and/or pressure level. Examples of hydrophobic phase-change materials used herein include wax and phase-change ink. As used herein, the term "phase-change ink" refers to a type of ink that is substantially solid at room temperature but softens and liquefies at elevated temperatures. Some inkjet printers eject liquefied drops of phase-change ink onto indirect image receiving surfaces, such as a rotating drum or endless belt, to form a latent ink image. The latent ink image is transferred to a substrate, such as a paper sheet. Other inkjet printers eject the ink drops directly onto a print medium, such as a paper sheet or an elongated roll of paper. In a liquid state, the phase-change material can penetrate a porous substrate, such as paper.

In a traditional inkjet printer, the phase change ink is transferred to one side of a substrate, with an option to transfer different phase change ink images to two sides of a substrate in a duplex printing operation. The printer spreads the phase change ink drops on the surface of the substrate, and the phase change ink image cools and solidifies on the surface of the print medium to form a printed image. The embodiments described below, however, apply heat and pressure to phase-change ink or another hydrophobic material on the surface of the substrate to enable the hydrophobic material to penetrate through the porous material in the substrate to form a three-dimensional barrier through the thickness of the substrate that controls the diffusion of fluids through the substrate.

FIG. 1A depicts a schematic diagram of an inkjet printing system 100 that forms structures from a hydrophobic material in a hydrophilic substrate. The system 100 includes a first side print zone 104, a second side print zone 108, a two-sided convection heater 112, and a digital controller 120. The first side print zone 104 and the second side print zone 108 each include at least one printhead that includes a plurality of inkjets. The inkjets emit drops of a hydrophobic material to form predetermined printed arrangements of the hydrophobic material on first and second sides of a hydrophilic print medium 152. A digital controller 120, such as a digital microprocessor or microcontroller, controls the operation of the printheads in the print zones 104 and 108 in addition to other components in the printer 100. In the system 100, the print medium 152 is a continuous print medium, such as an elongated roll of paper or other hydrophilic substrate material. In the system 100 a media transport (not shown) moves an elongated print medium 150 in a process direction P past the first side print zone 104, second side print zone 108, and the two-sided convection heater 112. Typical embodiments of media transports use one or more rollers and actuators to support and move the print medium 152 in the process direction P at a predetermined velocity.

During operation, the print medium 152 moves in the process direction P through the first print zone 104 and the second print zone 108. The inkjets in the first print zone 104 eject drops of the hydrophobic material to form a first predetermined arrangement 160 on a region the first side of the print medium 152. The print medium 152 continues to move past the second side print zone 108 where a second plurality of inkjets ejects drops of the hydrophobic material to form a second arrangement 162 on the second side of the region of the print medium 152. In the printer 100, the print zones 104 and 108 include separate printheads that form printed arrangements of the hydrophobic material on two different sides of the same region of the print medium 152. In other embodiments, the media transport includes a duplexing device that returns the print medium to the first print zone for the printheads to print on the second side of the print medium. While FIG. 1A depicts a duplexed printing system that forms printed arrangements of the hydrophobic material on both sides of the print medium, alternative printer embodiments only form the arrangement of the hydrophobic material on one side of the print medium.

Figure 6:
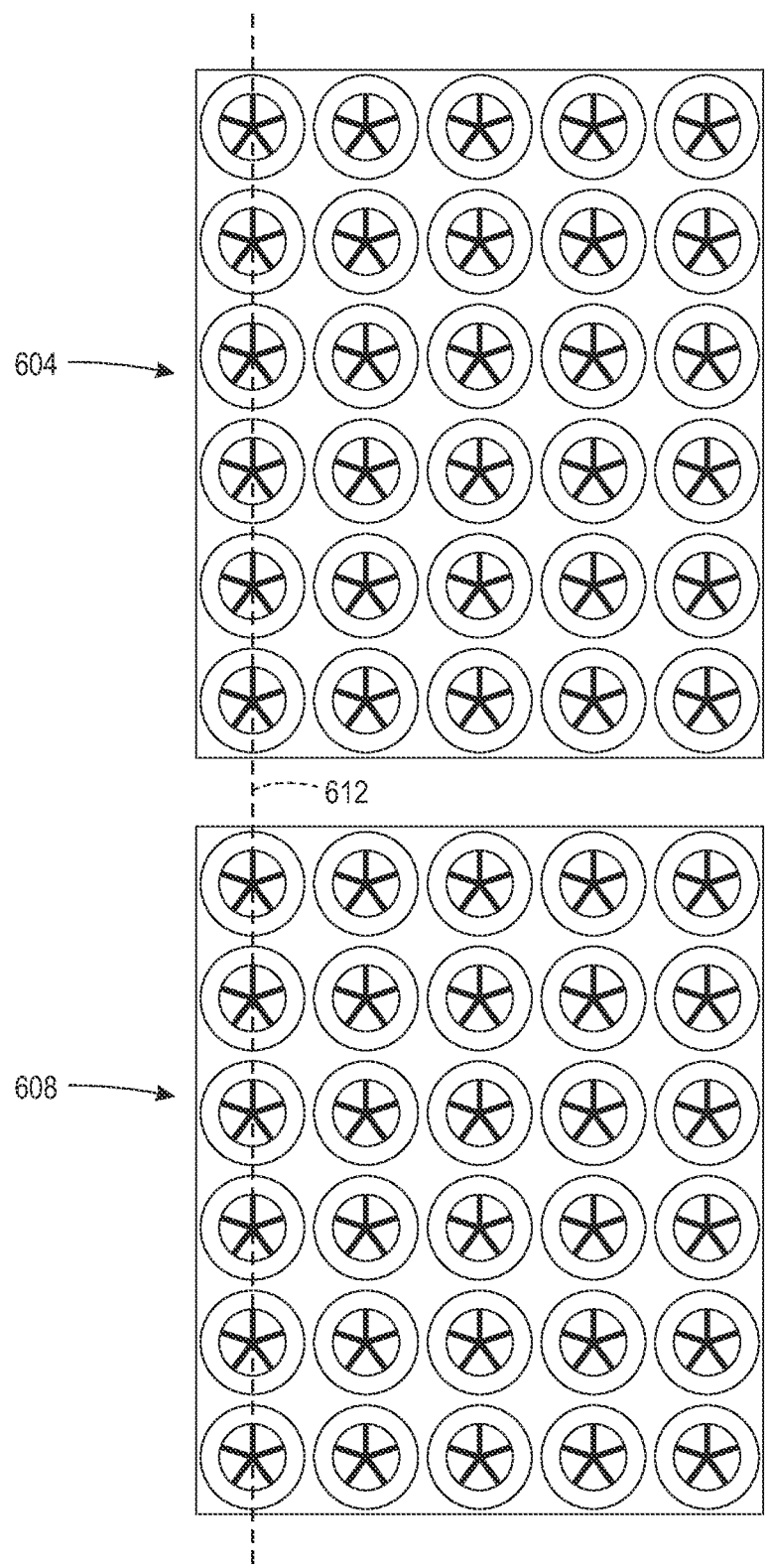
FIG. 6 is a diagram depicting two arrangements of hydrophobic material that are formed on opposite sides of a hydrophilic print medium.
Figure 7A:
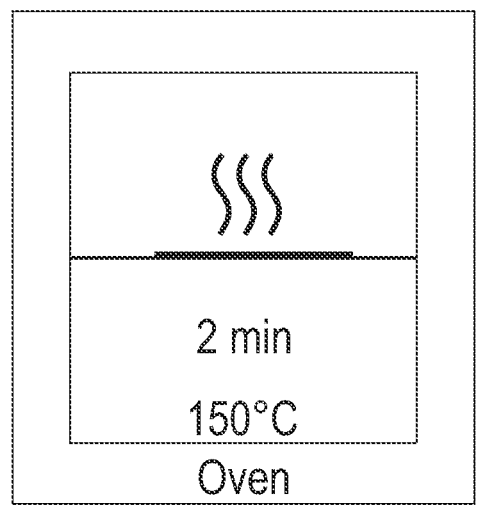
FIG. 7A is a diagram of a prior art reflow oven that melts a hydrophobic material formed on a surface of a substrate.
Figure 7B:
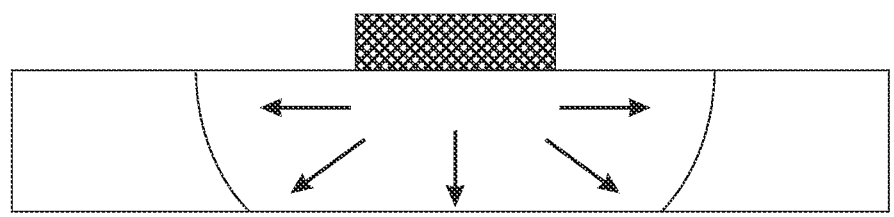
FIG. 7B is a diagram depicting the spread of hydrophobic material on a substrate in the reflow oven of FIG. 7A in a prior art spreading process.

The print zones 104 and 108 form the printed arrangements of the hydrophobic material in a mirrored arrangement on both sides of the print medium 152 to enable the hydrophobic material to penetrate the print medium from both sides and merge together to form hydrophobic structures in the hydrophilic material of the print medium 152. For example, FIG. 6 depicts two printed arrangements 604 and 608 of fluid test chambers that are formed from hydrophobic material. The printed patterns in the arrangement 608 are mirrored along the line 612 with respect to the corresponding printed patterns in the arrangement 604. The controller 120 operates the inkjets in the print zones 104 and 108 to form the mirrored arrangements of the hydrophobic material in alignment with each other on both sides of the print medium 152.

Figure 5:
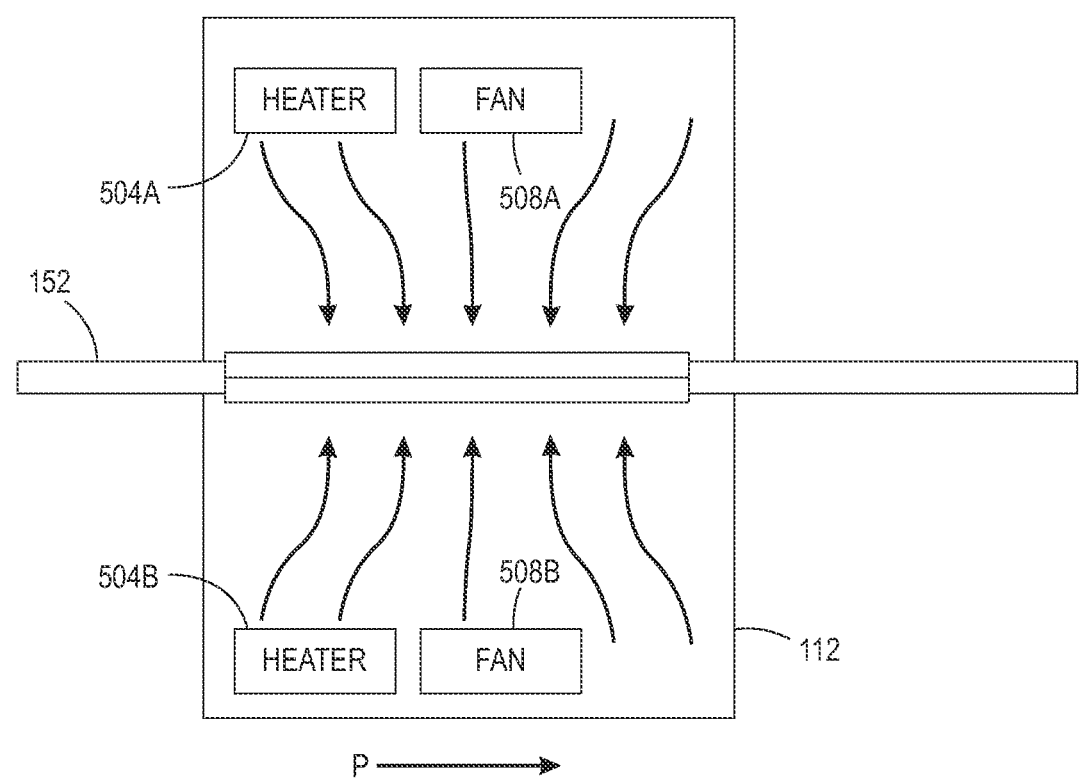
FIG. 5 is a schematic diagram depicting a convection heater that is incorporated in the printing systems of FIG. 1A, FIG. 1B, and FIG. 2.

Referring again to FIG. 1A, the print medium continues to move in the process direction P through the two-sided convection heater 112. The two-sided convection heater 112 includes at least one heating element, such as an electric heater, and at least one fan. The heating element generates heat to warm air to a predetermined temperature within the convection heater 112, and the fan circulates the warmed air around the print medium to promote convective heat transfer from the heater 112 to the hydrophobic material formed on the first and second sides of the print medium. FIG. 5 depicts one embodiment of the two-sided convection heater 112 in more detail. In the embodiment of FIG. 5, the convection heater 112 includes two heater elements 504A and 504B that are located on the first and second sides, respectively, of the print medium 152. The convection heater 112 also includes two fans 508A and 508B that circulate heated air around the first and second sides, respectively, of the print medium 152.

In the convection heater 112, the hydrophobic material formed on the first and second sides of the print medium 152 softens and melts. The melted hydrophobic material penetrates into the porous hydrophilic material of the print medium 152 to form hydrophobic structures that extend through the thickness of the print medium 152. After the print medium 152 exits the convection heater 112, the hydrophobic material cools and solidifies to form durable hydrophobic structures in the print medium 152. The spreading distance L of the liquefied hydrophobic material is provided by Washburn's equation:

$$L = \sqrt{\frac{\gamma D t}{4 \eta}}$$

where $\gamma$ is the surface tension of the melted hydrophobic material, D is the pore diameter of pores in the print medium 152, t is the dwell time of the substrate in the convection heater during which the increased temperature reduces the viscosity of the hydrophobic material, and $\eta$ is the viscosity of the melted hydrophobic liquid. The surface tension $\gamma$ and viscosity $\eta$ terms are empirically determined from the properties of the hydrophobic material. The pore diameter D is empirically determined from the type of paper or other hydrophilic material that forms the print medium 152. The convection heater has direct or indirect control over viscosity $\eta$ of the hydrophobic material as the hydrophobic material and substrate move through the convection heater along the media path. The printer controls the velocity of the print medium that bears the two layers of hydrophobic material to control the time t corresponding to how long the hydrophobic material remains in a liquefied state in the convection heater.

In the convection heater, the hydrophobic materials such as wax or phase-change inks transition into a liquid state with varying levels of viscosity based on the temperature of the material. The viscosity of the liquefied hydrophobic material is inversely related to the temperature of the material. The convection heater applies a controlled heating process to enable the hydrophobic material formed on both sides of the print medium to penetrate into the print medium in a controller manner. The two layers of hydrophobic material merge within the hydrophilic print medium to form fluid channels and other hydrophobic structures that extend through substantially the entire thickness of the print medium.

As discussed above, the printing system 100 controls temperature and air flow in the convection heater 112 and the amount of time that each region of the print medium 152 spends in the convection heater 112 to control the melting and spread of hydrophobic material into the print medium 152. In one configuration, the convection heater 112 warms a region of the print medium 152 with a length of approximately 1.6 meters. The "dwell time" of the print medium in the convection heater 112 refers to an amount of time that each location on the print medium spends within the convection heater 112. For example, in an embodiment where the media transport moves the print medium 152 at a rate of 1.65 meters per second, the dwell time in the convection heater 112 is approximately 0.97 seconds. In one configuration, the heaters 504A and 504B heat the air in the convection heater 112 to approximately 190° C. and the fans 508A and 508B circulate the heated air at a rate of approximately 325 cubic meters per minute. In alternative configurations, the heaters 504A and 504B heat the air to a temperature in a range from approximately 180° Celsius (C) to 200° C. and the fans 508A and 508B circulate air in a range from approximately 300 cubic meters per minute to 350 cubic meters per minute.

Figure 1B:
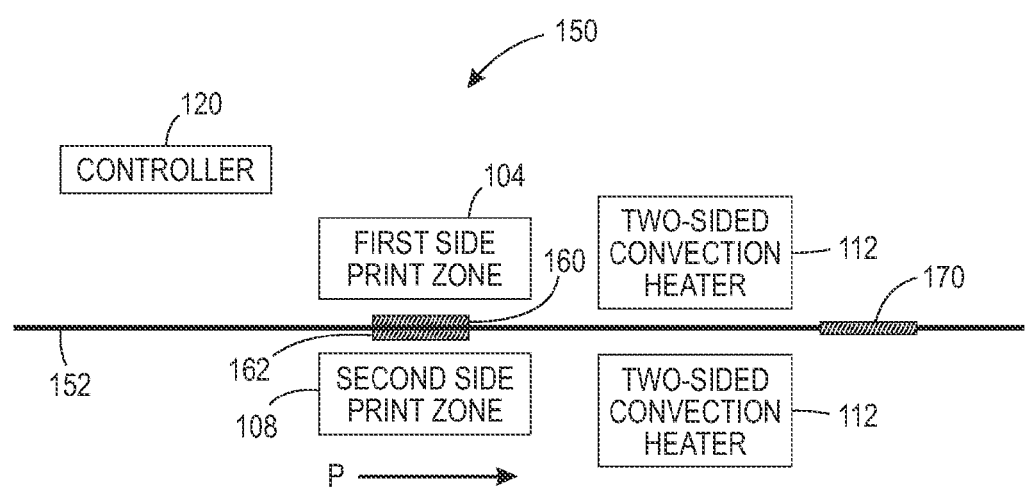
FIG. 1B is a schematic diagram of another embodiment of an inkjet printing system that forms hydrophobic structures in a hydrophilic print medium.

FIG. 1B depicts a schematic diagram of another embodiment of an inkjet printing system 150. The inkjet printing system 150 also includes the first print zone 104, second print zone 108, two-sided convection heater 112, and controller 120 of the printing system 100. In the configuration of FIG. 1B, the first print zone 104 and the second print zone 108 are configured to eject drops of the hydrophobic material onto the first side and second side, respectively, of the print medium 152 concurrently. Thus, in the configuration of FIG. 1B, the inkjets in the first print zone 104 form the first side arrangement of the hydrophobic material 160 concurrently to the operation of the inkjets in the second print zone 108 to form the second side arrangement of the hydrophobic material 162.

In both the embodiments of FIG. 1A and FIG. 1B, the media transport moves the continuous print medium 152 past the first print zone 104, second print zone 108, and the two-sided convection heater 112 at a substantially uniform velocity to form the printed hydrophobic structures 170 in the hydrophilic material of the print medium 152. The two-sided convection heater 112 controls the melting of the hydrophobic material in both the first side arrangement 160 and second side arrangement 162 to enable the hydrophobic material to penetrate the print medium 152 in a controlled manner while the print medium 152 continues to move in the process direction P. In one embodiment of the systems 100 and 150, the media transport moves the print medium 152 at a rate of approximately 1.65 meters per second, and each location of the print medium 152 moves through the two-sided convection heater 112 in approximately one second. Thus, the two-sided convection heater 112 melts the hydrophobic material in the first arrangement 160 and second arrangement 162 to enable the melted hydrophobic material to form the hydrophobic structures 170 that extend through the thickness of the printed substrate 152 in approximately one second instead of several minutes as required by prior art reflow ovens.

Figure 2:
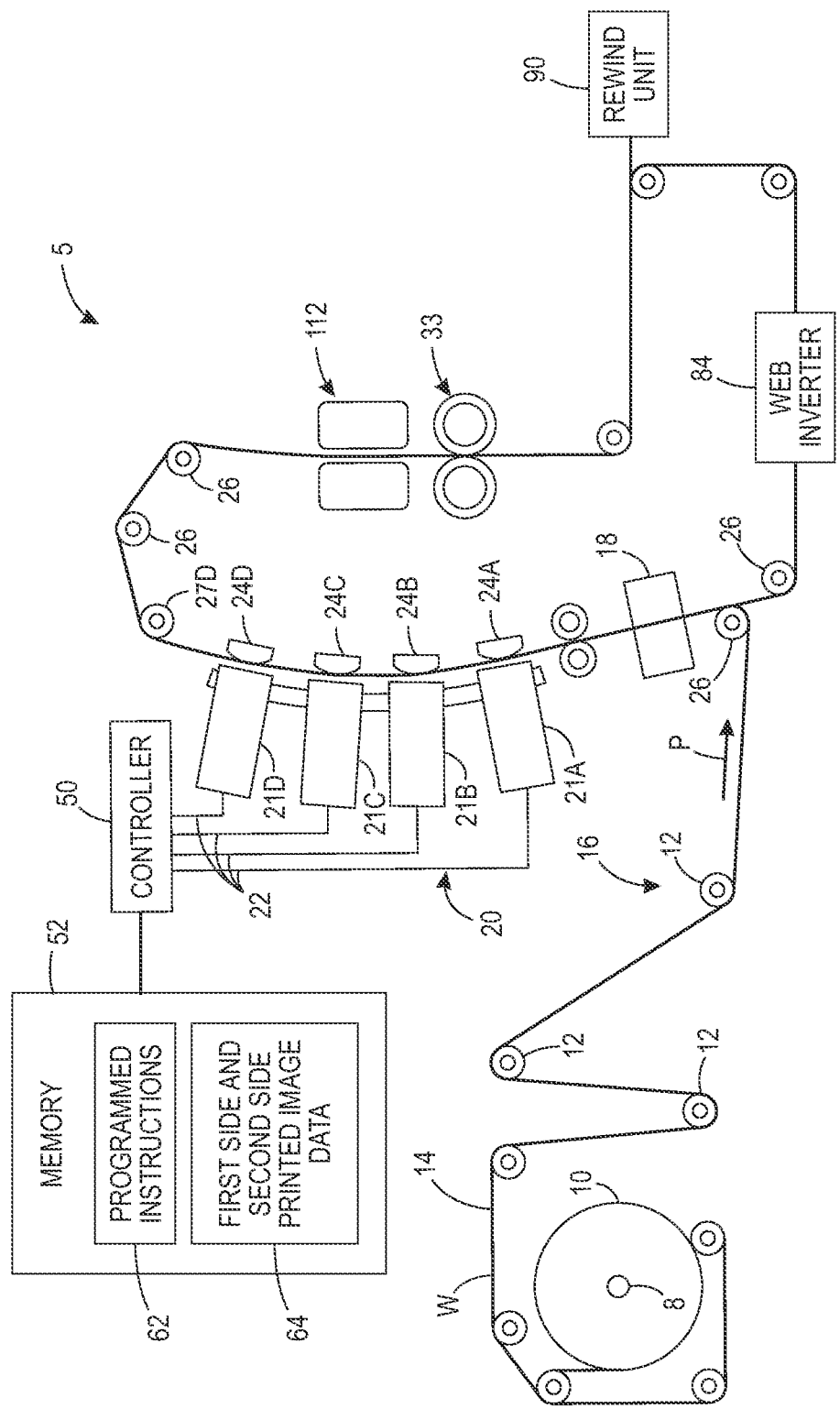
FIG. 2 is a schematic diagram of another embodiment of an inkjet printer that forms hydrophobic structures in a hydrophilic print medium.

FIG. 2 depicts another embodiment of an inkjet printer 5 that is configured to form hydrophobic structures in a hydrophilic continuous print medium. FIG. 2 is a simplified schematic view of the direct-to-sheet, continuous-media, phase-change inkjet printer 5, that is configured to generate printed arrangements of the hydrophobic material using a plurality of printheads positioned in a print zone in the printer. A media supply and handling system is configured to supply a long (i.e., substantially continuous) web of media 14 of "substrate" from a media source, such as a spool of media 10 mounted on a web roller 8. For simplex printing, the printer includes the web roller 8, media conditioner 16, print zone or printing station 20, and rewind unit 90. For duplex operations, the web inverter 84 is used to flip the web to present a second side of the media to the printing station 20 before being taken up by the rewind unit 90. In the simplex operation, the media source 10 has a width that substantially covers the width of the rollers 12 and 26 over which the media travels through the printer. In duplex operation, the media source has a width that is approximately one-half of the width of the rollers. Thus, the web can travel over about one-half of the length of the rollers in the printing station 20 before being flipped by the inverter 84 and laterally displaced by a distance that enables the web to travel over the other half of the length of the rollers in the printing station 20. The rewind unit 90 is configured to wind the web onto a roller for removal from the printer and subsequent processing.

The media can be unwound from the source 10 as needed and propelled by a variety of motors, not shown, rotating one or more rollers. The media conditioner includes rollers 12 and a pre-heater 18. The rollers 12 control the tension of the unwinding media as the media moves along a path through the printer. In alternative embodiments, the media can be transported along the path in cut sheet form in which case the media supply and handling system can include any suitable device or structure that enables the transport of cut media sheets along an expected path through the imaging device. The pre-heater 18 brings the web to an initial predetermined temperature that is selected for desired image characteristics corresponding to the type of media being printed as well as the type, colors, and number of inks being used. The pre-heater 18 can use contact, radiant, conductive, or convective heat to bring the media to a target preheat temperature, which in one practical embodiment, is in a range of about 30° C. to about 70° C.

The media are transported through a printing station 20 that includes a series of color units 21A, 21B, 21C, and 21D, each color unit effectively extending across the width of the media and being able to place a marking agent directly (i.e., without use of an intermediate or offset member) onto the moving media. The controller 50 is operatively connected to the color units 21A-21D through control lines 22. Each of the color units 21A-21D includes a plurality of printheads positioned in a staggered arrangement in the cross-process direction over the media web 14. In some embodiments at least one of the color units 21A-21D ejects drops of hydrophobic material onto the surface of the media web 14. In some embodiments, multiple color units eject the hydrophobic material to form thicker layers of the hydrophobic material in the printed arrangements formed on the surface of the media web 14. In some embodiments, one or more of the color units 21A-21D eject drops of ink or other marking agents that form printed text and graphics on the surface of the media web in addition to the arrangements of the hydrophobic material that form hydrophobic structures within the hydrophilic material of the media web 14.

During operation, the controller 50 of the printer receives velocity data from encoders mounted proximately to rollers positioned on either side of the portion of the path opposite the four printheads to compute the position of the web as moves past the printheads. The controller 50 uses these data to generate timing signals for actuating the inkjets in the printheads to enable the color units 21A-21D to eject drops of the hydrophobic material onto the first and second sides of the media web 14 with a reliable degree of accuracy to form hydrophobic structures within the media web 1. The inkjets actuated by the firing signals correspond to image data processed by the controller 50. The image data can be transmitted to the printer, generated by a scanner (not shown) that is a component of the printer, or otherwise electronically or optically generated and delivered to the printer. In various alternative embodiments, the printer 5 includes a different number of color units.

Associated with each of color units 21A-21D is a corresponding backing member 24A-24D, respectively. The backing members 24A-24D are typically in the form of a bar or roll, which is arranged substantially opposite the printhead on the back side of the media. Each backing member is used to position the media at a predetermined distance from the printhead opposite the backing member. In the embodiment of FIG. 2, each backing member includes a heater that emits thermal energy to heat the media to a predetermined temperature which, in one practical embodiment, is in a range of about 40° C. to about 60° C. The various backer members can be controlled individually or collectively. The pre-heater 18, the printheads, backing members 24 (if heated), as well as the surrounding air combine to maintain the media along the portion of the path opposite the printing station 20 in a predetermined temperature range of about 40° C. to 70° C.

As the partially-imaged media web 14 moves to receive inks of various colors from the printheads of the print zone 20, the printer 5 maintains the temperature of the media web within a given range. The printheads in the color units 21A-21D eject the hydrophobic material at a temperature typically significantly higher than the temperature of the media web 14. Consequently, the ink heats the media. Therefore, other temperature regulating devices may be employed to maintain the media temperature within a predetermined range. For example, the air temperature and air flow rate behind and in front of the media may also impact the media temperature. Accordingly, air blowers or fans can be utilized to facilitate control of the media temperature. Thus, the printer 5 maintains the temperature of the media web 14 within an appropriate range for the jetting of all inks from the printheads of the print zone 20. Temperature sensors (not shown) can be positioned along this portion of the media path to enable regulation of the media temperature.

Figure 3:
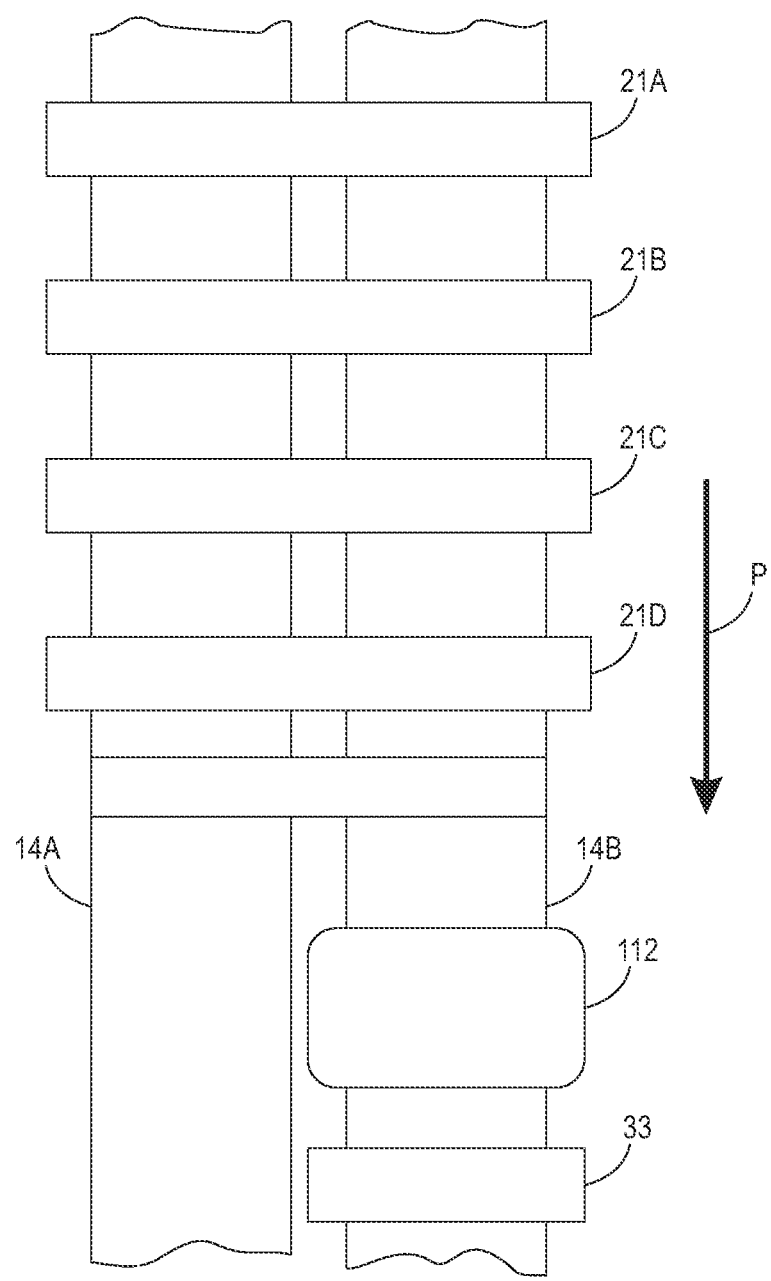
FIG. 3 is a schematic view of a portion of the media path in the printer of FIG. 2.

In the printer 5, the media transport moves the media web 14 through the print zone 20 two times for first and second side printing. The web inverter 84 flips the media web 14 after the first pass through the print zone 20 and the media transport returns the media web 14 to the print zone 20 with the second side facing the printheads in the color units 21A-21D for second side printing. FIG. 3 depicts a schematic view of a portion of the media path in the printer 5. In FIG. 3, the tandem duplex configuration of the print zone 20 includes the first side of the media web 14A that passes a first set of printheads in each of the color units 21A-21D. The first set of printheads includes a plurality of inkjets that form the arrangements of hydrophobic material in predetermined patterns on the first side of the media web 14. The web inverter unit 84 flips the media web 14 and the media transport returns the second side 14B to the print zone 20 for a second set of the printheads in the color units 21A-21D to form the arrangements of the hydrophobic material on the second side of the media web 14. In the configuration of FIG. 3, the first set of printheads that print on the first side 14A form the first print zone and the second set of printheads that print on the second side 14B form the second print zone.

After moving through the convection heater 112, the media transport moves the media web 14 between cooling rolls 33 and to a rewind unit 90. The cooling rolls 33 are, for example, two metal rolls that maintain a uniform temperature as the media web 14 moves in the process direction. The cooling rolls 33 extract heat from the media web 14 and hydrophobic material in the media web 14 to cool and solidify the hydrophobic material into durable structures that penetrate through the thickness of the hydrophilic material in the media web 14. The rewind unit 90 includes a spool or other suitable device to return the continuous media web 14 to a spooled form after the printer 5 has formed the hydrophobic material structures in the media web 14. The spooled media web is removed from the printer 5 and sent for further processing, such as cutting the large roll of paper into smaller sheets incorporating one or more chemical assay devices that include the hydrophobic structures that are formed in the printer 5.

Following the print zone 20 along the media path, the media web 14 moves to the convection heater 112. In configuration of FIG. 2, the convection heater only receives the media web 14 after the media web 14 has passed through the print zone 20 for a second time for second-side printing. The convection heater 112 is a two-sided convection heater that operates in the same manner described above with regards to FIGS. 1A-1B and FIG. 5. In the printer 5, the convection heater 112 heats the air around the media web 14 to a temperature in a range from approximately 180° C. to 200° C. and the fans in the convection heater 112 circulate the heated air in a range from approximately 300 cubic meters per minute to 350 cubic meters per minute. The media transport in the printer 5 moves the media web 14 at a rate of approximately 1.65 meters per second, and the convection heater 112 is configured with a length of approximately 1.6 meters along the process direction P to provide a dwell time of slightly less than one second in the convection heater 112. The convection heater 112 melts the hydrophobic material in the first-side and second-side printed arrangements to enable the hydrophobic material to penetrate the media web 14 from both sides and form hydrophobic structures that extend through the entire thickness of the media web 14.

Operation and control of the various subsystems, components and functions of the printer 5 are performed with the aid of the controller 50. The controller 50 is implemented with general or specialized programmable processors that execute programmed instructions. The memory 52 stores instructions code 62 containing the instructions required to perform the programmed functions. The controller 50 is operatively connected to the memory 52. The memory 52 includes volatile data storage devices such as random access memory (RAM) and non-volatile data storage devices including magnetic and optical disks or solid state storage devices. The processors, their memories, and interface circuitry configure the controllers and/or print engine to perform the functions, such as the difference minimization function, described above. These components are provided on a printed circuit card or provided as a circuit in an application specific integrated circuit (ASIC). In one embodiment, each of the circuits is implemented with a separate processor device. Alternatively, the circuits can be implemented with discrete components or circuits provided in VLSI circuits. Also, the circuits described herein can be implemented with a combination of processors, ASICs, discrete components, or VLSI circuits.

As described in more detail below, the controller 50 executes stored program instructions 62 in the memory 52 to form printed patterns on the media web 14 with reference to image data 64 that correspond to the first-side and second-side printed arrangements of the hydrophobic material. The controller 50 operates the printheads and corresponding inkjets in the color units 21A-21D to form printed arrangements of the hydrophobic material on the media web 14 with reference to the image data 64. The controller 50 forms the printed arrangements in the shapes of walls, wells, fluid channels, and other structures that control the diffusion of fluids through the hydrophilic material of the media web 14. In the printer 5, the first side and second side image data are mirrored in a similar manner to the depiction of FIG. 6 to align the printed patterns of the hydrophobic material on both sides of the print medium 14.

Figure 4:
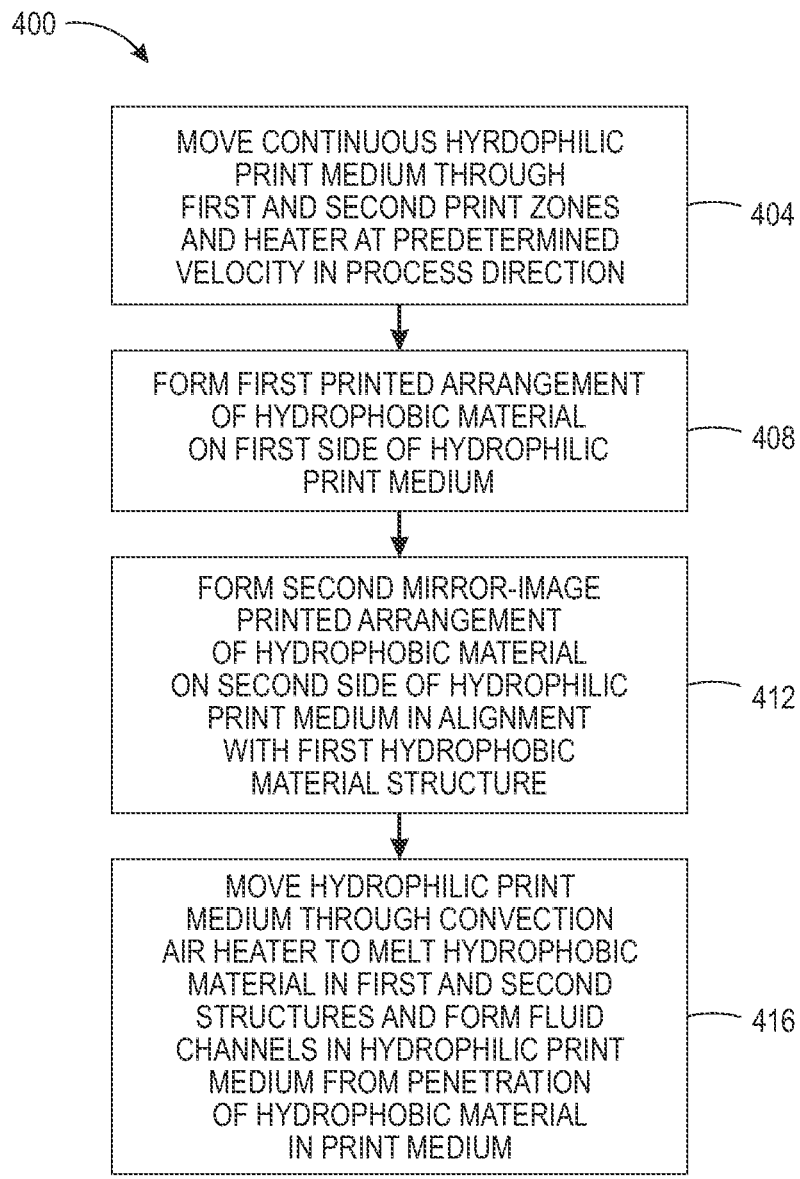
FIG. 4 is a block diagram of a process for forming hydrophobic structures in a hydrophilic print medium.

FIG. 4 is a block diagram of a process 400 for producing hydrophobic structures in a hydrophilic print medium. In the discussion below, a reference to the process 400 performing a function or action refers to the operation of a controller to execute stored program instructions to perform the function or action in conjunction with other components in a printer. Process 400 is described in conjunction with the printing system embodiments of FIG. 1A, FIG. 1B, FIG. 2 and FIG. 3.

The process 400 begins as the media transport moves the print medium at a predetermined velocity in the process direction past a first print zone, second print zone, and a convection heater (block 404). As depicted above, each of the printer embodiments 100, 150, and 5 moves the print medium at a predetermined velocity, such as approximately 1.65 meters per second. The print medium remains in motion during process 400 without having to stop or change velocity to enable the printed hydrophobic material to penetrate into the print medium to form hydrophobic structures.

Process 400 continues as the printer forms a first printed arrangement of the hydrophobic material on the first side of the print medium (block 408). In the printer 5, the controller 50 operates the inkjets in the print zone 20 that are aligned with the first side of the media web 14 to form printed arrangements of the hydrophobic material with reference to the first-side image data 64 stored in the memory 52. The printed arrangement of the hydrophobic material corresponds to walls, channels, chambers, and other hydrophobic structures that are formed in the print medium.

Process 400 continues as the printer forms a second printed arrangement of the hydrophobic material on the second side of the print medium in alignment with the first printed arrangement of the hydrophobic material (block 412). As described above, some embodiments of the process 400 omit the second-side printing of the hydrophobic material and form the hydrophobic structures in the print medium using only one arrangement of the hydrophobic material that is formed on one side of the print medium. The inkjets in the first print zone and the second print zone form the first-side and second-side printed arrangements of the hydrophobic material in the same region of the print medium in alignment with each other along the process direction. Additionally, the printers form the first-side and second-side arrangements of the hydrophobic material in a mirror image configuration, such as the configurations of the printed arrangements 604 and 608 from FIG. 6, to align hydrophobic material on the first side of the print medium with a corresponding hydrophobic material on the second side of the print medium.

Process 400 continues as the printer moves the print medium with the first-side and second-side printed arrangements of the hydrophobic material through the convection heater to enable the hydrophobic material to penetrate the hydrophilic print medium (block 416). As described above, the convection heater 112 heats air to a predetermined temperature, such as in a range of 180° C. to 200° C., and the fans in the convection heater 112 circulate the heated air at a rate of approximately 300 to 350 cubic meters per minute. The dwell time of each region of the print medium in the convection heater is determined by the length of the convection heater and the predetermined velocity of the print medium in the process direction. For example, in the embodiments of FIG. 1A, FIG. 1B, and FIG. 2, the convection heater has a length of approximately 1.6 m and the media transport moves the print medium at a velocity of approximately 1.65 msec for a dwell time of approximately 0.97 sec. The convection heater 112 enables the hydrophobic material on one or both sides of the print medium to melt and to penetrate the print medium in a controlled manner to form hydrophobic structures that extend through the thickness of the hydrophilic material in the print medium. Those of skill in the art will recognize that the temperature, air flow, and dwell time parameters described above are merely illustrative of the embodiments described herein, and that alternative convection heater and printing system embodiments may be configured with different parameters.

It will be appreciated that various of the above-disclosed and other features, and functions, or alternatives thereof, may be desirably combined into many other different systems or applications. Various presently unforeseen or unanticipated alternatives, modifications, variations, or improvements therein may be subsequently made by those skilled in the art, which are also intended to be encompassed by the following claims.

What is claimed is:

1. A method of forming hydrophobic structures in a hydrophilic substrate comprising:
    moving with a media transport a print medium formed from a hydrophilic material in a process direction through a first print zone and a convection heater at a predetermined velocity;
    operating with a controller a first plurality of inkjets in the first print zone to form a first predetermined arrangement of a hydrophobic material on a region of a first side of the print medium as the print medium moves through the first print zone; and
    operating the convection heater to enable the first predetermined arrangement of the hydrophobic material to penetrate the hydrophilic substrate to form at least one hydrophobic structure within the region of the print medium as the region of the print medium moves through the convection heater.

2. The method of claim 1 further comprising:
    moving with the media transport the print medium in the process direction through a second print zone at the predetermined velocity;
    operating with the controller a second plurality of inkjets in the second print zone to eject a second predetermined arrangement of the hydrophobic material onto a second side of the region of the print medium as the print medium moves through the second print zone; and
    operating the convection heater to enable the first predetermined arrangement of the hydrophobic material and the second predetermined arrangement of the hydrophobic material to penetrate the hydrophilic substrate to form the at least one hydrophobic structure within the region of the print medium as the region of the print medium moves through the convection heater.

3. The method of claim 2, the operation of the first plurality of inkjets in the first print zone and the operation of the second plurality of inkjets in the second print zone further comprising:
    operating with the controller the first plurality of inkjets in the first print zone to form the first predetermined arrangement of the hydrophobic material on the first side of the region of the print medium prior to operating the second plurality of inkjets in the second print zone to form the second predetermined arrangement of the hydrophobic material on the second side of the region of the print medium.

4. The method of claim 2, the operation of the first plurality of inkjets in the first print zone and the operation of the second plurality of inkjets in the second print zone further comprising:
    operating with the controller the first plurality of inkjets in the first print zone and the second plurality of inkjets in the second print zone concurrently to form the first predetermined arrangement of the hydrophobic material on the first side of the region of the print medium and the second predetermined arrangement of the hydrophobic material on the second side of the region of the print medium.

5. The method of claim 2, the operation of the first plurality of inkjets in the first print zone and the operation of the second plurality of inkjets in the second print zone further comprising:
    operating with the controller the second plurality of inkjets in the second print zone to form the second predetermined arrangement of the hydrophobic material on the second side of the print medium in a mirrored arrangement of the first predetermined arrangement of the hydrophobic material on the first side of the print medium.

6. The method of claim 1, the operation of the convection heater further comprising:
    operating the convection heater to generate heated air at a first predetermined temperature around the print medium at a first predetermined temperature with a first predetermined rate of air flow to enable the first predetermined arrangement of the hydrophobic material to penetrate the hydrophilic substrate to form the at least one hydrophobic structure within the region of the print medium within a predetermined time period.

7. The method of claim 6, the operation of the convection heater further comprising:
    generating heated air at the first predetermined temperature in a range of between approximately 180 degrees Celsius and 200 degrees Celsius.

8. The method of claim 6, the operation of the convection heater further comprising:
    operating at least one fan associated with the convection heater to move the air at the first predetermined flow rate in a range of between approximately 300 cubic meters per minute and 350 cubic meters per minute.

9. The method of claim 6, the operation of the media transport further comprising:
    moving with the media transport the region of the print medium through the convection heater in approximately one second.

10. The method of claim 9, the operation of the media transport further comprising:

moving with the media transport the print medium in the process direction at the predetermined velocity of approximately 1.65 meters per second.

\* \* \* \* \*